US012796165B2

(12) United States Patent
Kim et al.

(10) Patent No.: US 12,796,165 B2
(45) Date of Patent: Nov. 10, 2026

(54) MICRO LED ALIGNMENT METHOD USING ELECTROSTATIC REPULSION, AND MICRO LED DISPLAY MANUFACTURING METHOD USING SAME

(71) Applicant: INDUSTRY-UNIVERSITY COOPERATION FOUNDATION HANYANG UNIVERSITY ERICA CAMPUS, Ansan-si (KR)

(72) Inventors: Jaekyun Kim, Ansan-si (KR); Byeong Woo Bak, Ansan-si (KR); Young Wook Shin, Ansan-si (KR)

(73) Assignee: INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 399 days.

(21) Appl. No.: 18/516,351

(22) Filed: Nov. 21, 2023

(65) Prior Publication Data

US 2024/0088117 A1 Mar. 14, 2024

Related U.S. Application Data

(63) Continuation of application No. PCT/KR2022/007165, filed on May 19, 2022.

(30) Foreign Application Priority Data

May 21, 2021 (KR) ........................ 10-2021-0065283
May 13, 2022 (KR) ........................ 10-2022-0059179

(51) Int. Cl.
*H10H 20/01* (2025.01)
*H10H 20/85* (2025.01)
(Continued)

(52) U.S. Cl.
CPC ........ *H10H 20/01* (2025.01); *H10H 20/8506* (2025.01); *H10H 20/857* (2025.01); *H10W 90/00* (2026.01); *H10H 20/0364* (2025.01)

(58) Field of Classification Search
CPC .... H10D 86/00; H10H 20/01; H10H 20/0364; H10H 20/8506; H10H 20/857; H10W 90/00
See application file for complete search history.

(56) References Cited

U.S. PATENT DOCUMENTS

2013/0027623 A1* 1/2013 Negishi ............. G02F 1/133603 438/30
2019/0180661 A1* 6/2019 Ju ........................ G01N 21/956

FOREIGN PATENT DOCUMENTS

KR 10-2017-0101334 A 9/2017
KR 10-2019-0079147 A 7/2019
(Continued)

OTHER PUBLICATIONS

Korean Notice of Allowance for related KR Application No. 10-2022-0059179 mailed Nov. 29, 2024 from Korean Intellectual Property Office.
(Continued)

*Primary Examiner* — Britt Hanley
*Assistant Examiner* — Kevin Quinto
(74) *Attorney, Agent, or Firm* — Paratus Law Group, PLLC

(57) ABSTRACT

A micro LED alignment method includes the steps of: (a) arranging, on a substrate, a first electrode layer and a second electrode layer spaced apart from each other; (b) arranging an insulation layer on the substrate on which the first electrode layer and the second electrode layer are arranged; (c) forming a plurality of grooves at regular intervals in a portion, of the insulation layer, corresponding to the region between the first electrode layer and the second electrode
(Continued)

layer; and (d) aligning the plurality of micro LEDs at regular intervals by means of repulsive force generated between one micro LED and another adjacent micro LED through the generation of an electric field in the first electrode layer and the second electrode layer, while supplying, onto the substrate, a solution containing the plurality of micro LEDs, wherein in step (d), one micro LED can be aligned with one groove.

20 Claims, 12 Drawing Sheets

(51) Int. Cl.

| | |
|---|---|
| ***H10H 20/857*** | (2025.01) |
| ***H10W 90/00*** | (2026.01) |

(56) References Cited

FOREIGN PATENT DOCUMENTS

| | | | | | |
|---|---|---|---|---|---|
| KR | 10-2019-0112226 A | | 10/2019 | | |
| KR | 10-2020-0030514 A | | 3/2020 | | |
| KR | 10-2020-0052512 A | | 5/2020 | | |
| KR | 20200053726 A | * | 5/2020 | ........... | H01L 27/156 |
| KR | 10-2020-0063380 A | | 6/2020 | | |
| KR | 10-2020-0088961 A | | 7/2020 | | |
| KR | 10-2020-0140179 A | | 12/2020 | | |
| KR | 10-2020-0140209 A | | 12/2020 | | |
| KR | 10-2021-0054436 A | | 5/2021 | | |

OTHER PUBLICATIONS

International Search Report for PCT/KR2022/007165 mailed Aug. 31, 2022 from Korean Intellectual Property Office.

U Hyeok Choi et al., "Precise Placement of Metallic Nanowires on a Substrate by Localized Electric Fields and Inter-Nanowire Electrostatic Interaction", Nanomaterials, Oct. 19, 2017, pp. 1-12, vol. 7.

Korean Office Action for related KR Application No. 10-2022-0059179 mailed Jan. 23, 2024 from Korean Intellectual Property Office.

Korean Notice of Allowance for related KR Application No. 10-2021-0065283 mailed Jun. 2, 2026 from Korean Intellectual Property Office.

* cited by examiner

MICRO LED ALIGNMENT METHOD USING ELECTROSTATIC REPULSION, AND MICRO LED DISPLAY MANUFACTURING METHOD USING SAME

CROSS-REFERENCE TO PRIOR APPLICATIONS

This Application is a Continuation Application of PCT International Application No. PCT/KR2022/007165 (filed on May 19, 2022), which claims priority to Korean Patent Application Nos. 10-2021-0065283 (filed May 21, 2021) and 10-2022-0059179 (filed May 13, 2022), which are all hereby incorporated by reference in their entirety.

BACKGROUND

The present disclosure relates to a method for aligning micro LEDs at a regular spacing using an electrostatic repulsion occurring between the plurality of micro LEDs and a method for manufacturing a micro LED display using the same.

A display device displays a screen using a plurality of pixels that constitute a display panel. Each of such pixels may be divided into sub-pixels, each of which emits light of a single color of R (Red), G (Green), or B (Blue). Each pixel may render any color from true black to white depending on intensities of light of the R, G, and B colors.

To render all of the colors, one pixel requires micro LEDs that constitute the sub-pixels, each of which may render each of at least one R, G, and B colors.

Because the micro LED is made of an inorganic material such as GaN and AlGaInP, the micro LED is known to have excellent durability.

Furthermore, the micro LED generates less heat and consumes less power because one side thereof has a small size equal to or smaller than 100 μm.

A micro LED display using the micro LED has high durability and long lifespan because of a nature of an inorganic element, so that it is more advantageous for the micro LED display to be applied to a mobile display.

Furthermore, the micro LED display may also be implemented as a flexible display.

Furthermore, because of a nature of the micro LED, the micro LEDs may be assembled in a module format, so that the micro LED may be applied to a large ultra-high definition display.

In one example, in a process of manufacturing the micro LED display, the micro LEDs are aligned in a manner of being directly transferred at RGB pixel locations.

Research is in progress to increase a yield of the micro LED by aligning and transferring the micro LEDs onto a substrate via a direct transfer technology, such as a transfer medium in a form of a stamp, an electrostatic head, a transfer medium of the carrier substrate with an electromagnet inserted, or a transfer scheme using static electricity or a laser.

In such scheme, the micro LEDs may be aligned at desired locations.

However, because of a great deviation in a spacing between the micro LEDs, there is a fundamental limitation in aligning the micro LEDs at precise locations.

Furthermore, because such scheme is the direct transfer scheme, it is difficult to re-manufacture a defective product, which is costly and is not suitable for mass transfer.

Therefore, there is an urgent need to develop a technology that may accurately align the plurality of micro LEDs at a regular spacing and align the same correctly at the desired locations.

SUMMARY

The present disclosure is to provide a micro LED alignment method that may align a plurality of micro LEDs at a regular spacing by an electrostatic repulsion.

Furthermore, the present disclosure is to provide a micro LED alignment method that may further improve an assembly yield of micro LEDs.

Furthermore, the present disclosure is to provide a micro LED alignment method that aligns micro LEDs at precise locations.

Furthermore, the present disclosure is to provide a micro LED alignment method that aligns one micro LED in one groove.

Furthermore, the present disclosure is to provide a micro LED display manufacturing method for arranging one micro LED for each pixel area.

Furthermore, the present disclosure is to provide a micro LED display manufacturing method that may be applied to manufacturing of a small and high-resolution display.

Furthermore, the present disclosure is to provide a micro LED display manufacturing method that may be utilized in various fields such as an optical sensor, optical communication, semiconductor integration, a headlamp for a vehicle, a smart textile, and a bio contact lens.

Purposes of the present disclosure are not limited to the purposes mentioned above, and other purposes and advantages of the present disclosure not mentioned may be understood by a description below and may be more clearly understood by the embodiments of the present disclosure. Furthermore, it will be readily apparent that the purposes and the advantages of the present disclosure may be realized by means and combinations thereof indicated in the patent claims.

A method for aligning micro LEDs according to a first embodiment of the present disclosure includes (a) disposing a first electrode layer and a second electrode layer spaced apart from each other on a substrate, (b) disposing an insulating layer on the substrate where the first electrode layer and the second electrode layer are disposed, (c) defining a groove in the insulating layer corresponding to an area between the first electrode layer and the second electrode layer, and (d) applying an electric signal to the first electrode layer and the second electrode layer while supplying a solution containing the micro LEDs onto the substrate, and generating an electric field with a non-uniform magnitude to align the micro LED in the groove, wherein one micro LED is aligned in one groove.

A method for aligning micro LEDs according to a second embodiment of the present disclosure includes (a) disposing a first electrode layer and a second electrode layer spaced apart from each other on a substrate, (b) disposing an insulating layer on the substrate where the first electrode layer and the second electrode layer are disposed, (c) defining a plurality of grooves at a regular spacing in a portion of the insulating layer corresponding to an area between the first electrode layer and the second electrode layer, and (d) generating an electric field in the first electrode layer and the second electrode layer while supplying a solution containing the plurality of micro LEDs onto the substrate to align the plurality of micro LEDs at a regular spacing by a repulsion occurring between one micro LED and a further micro LED adjacent thereto, wherein the (d) includes aligning one micro LED in one groove.

According to the first embodiment or the second embodiment, in the (d), a spacing between the one micro LED and the further micro LED adjacent thereto may be greater than a diameter of the micro LED.

Furthermore, according to the first embodiment or the second embodiment, the (d) may include further aligning at least one micro LED between one groove and a further groove adjacent thereto.

Furthermore, according to the first embodiment or the second embodiment, in the (d), the solution containing the plurality of micro LEDs may contain $1\times10^3$ to $1\times10^7$ micro LEDs for each 1μℓ of the solution.

According to the first embodiment or the second embodiment, a length of the groove may be greater than a length of the micro LED.

According to the first embodiment or the second embodiment, each of a length of the groove and a length of the micro LED may be greater than a distance of the area between the first electrode layer and the second electrode layer.

According to the first embodiment or the second embodiment, in the (d), a magnitude of the electric field in the groove may be greater than a magnitude of the electric field in an area other than the groove.

A method for manufacturing a micro LED display according to the present disclosure includes (a) disposing a transistor in each of a plurality of pixel areas defined as data lines and gate lines intersect each other on a substrate, (b) disposing a first electrode layer and a second electrode layer spaced apart from each other in each of the plurality of pixel areas, (c) disposing an insulating layer on the substrate where the first electrode layer and the second electrode layer are disposed, (d) defining a groove in a portion of the insulating layer corresponding to an area between the first electrode layer and the second electrode layer, and (e) applying an electric signal to the first electrode layer and the second electrode layer while supplying a solution containing a plurality of micro LEDs onto the substrate, and generating an electric field with a non-uniform magnitude to align one micro LED in one groove, wherein one micro LED is disposed in each pixel area.

A method for manufacturing a micro LED display according to another embodiment of the present disclosure includes (a) disposing a transistor in each of a plurality of pixel areas defined as data lines and gate lines intersect each other on a substrate, (b) disposing a first electrode layer and a second electrode layer spaced apart from each other in each of the plurality of pixel areas, (c) disposing an insulating layer on the substrate where the first electrode layer and the second electrode layer are disposed, (d) defining a plurality of grooves at a regular spacing in a portion of the insulating layer corresponding to an area between the first electrode layer and the second electrode layer, and (e) generating an electric field in the first electrode layer and the second electrode layer while supplying a solution containing a plurality of micro LEDs onto the substrate to align the plurality of micro LEDs at a regular spacing by a repulsion occurring between one micro LED and a further micro LED adjacent thereto, wherein the (e) includes aligning one micro LED in one groove, wherein one micro LED is disposed in each pixel area.

The (e) may be performed for each of the plurality of pixel areas as follows.

An electric signal may be applied to a first electrode layer and a second electrode layer connected to a red pixel while supplying a solution containing red micro LEDs among a plurality of micro LEDs to arrange the plurality of red micro LEDs at a regular spacing.

Furthermore, an electric signal may be applied to a first electrode layer and a second electrode layer connected to a green pixel while supplying a solution containing green micro LEDs among the plurality of micro LEDs to arrange the plurality of green micro LEDs at a regular spacing.

Furthermore, an electric signal may be applied to a first electrode layer and a second electrode layer connected to a blue pixel while supplying a solution containing blue micro LEDs among the plurality of micro LEDs to arrange the plurality of blue micro LEDs at a regular spacing.

The micro LED alignment method using the electrostatic repulsion according to the present disclosure may align the plurality of micro LEDs at the regular spacing.

Furthermore, according to the present disclosure, the assembly yield and efficiency of the micro LEDs may be further improved.

Furthermore, according to the present disclosure, the micro LEDs may be aligned at the precise locations to be aligned, and the one micro LED may be aligned in the one groove.

Furthermore, according to the present disclosure, the relatively intense electric field is formed in the groove of the insulating layer, so that the error range for the alignment location may be minimized to be equal to or smaller than 0.1 μm to improve location accuracy.

The micro LED display manufacturing method in the present disclosure uses the micro LED alignment method using the electrostatic repulsion, so that the one micro LED may be disposed for each pixel area.

Furthermore, the small and high-resolution display may be manufactured via the micro LED display manufacturing method, and may be utilized in the various fields such as the optical sensor, the optical communication, the semiconductor integration, the headlamp for the vehicle, the smart textile, and the bio contact lens.

In addition to the effects described above, specific effects of the present disclosure will be described below while describing the specific details for carrying out the invention.

REFERENCE NUMERALS

Figure 1:
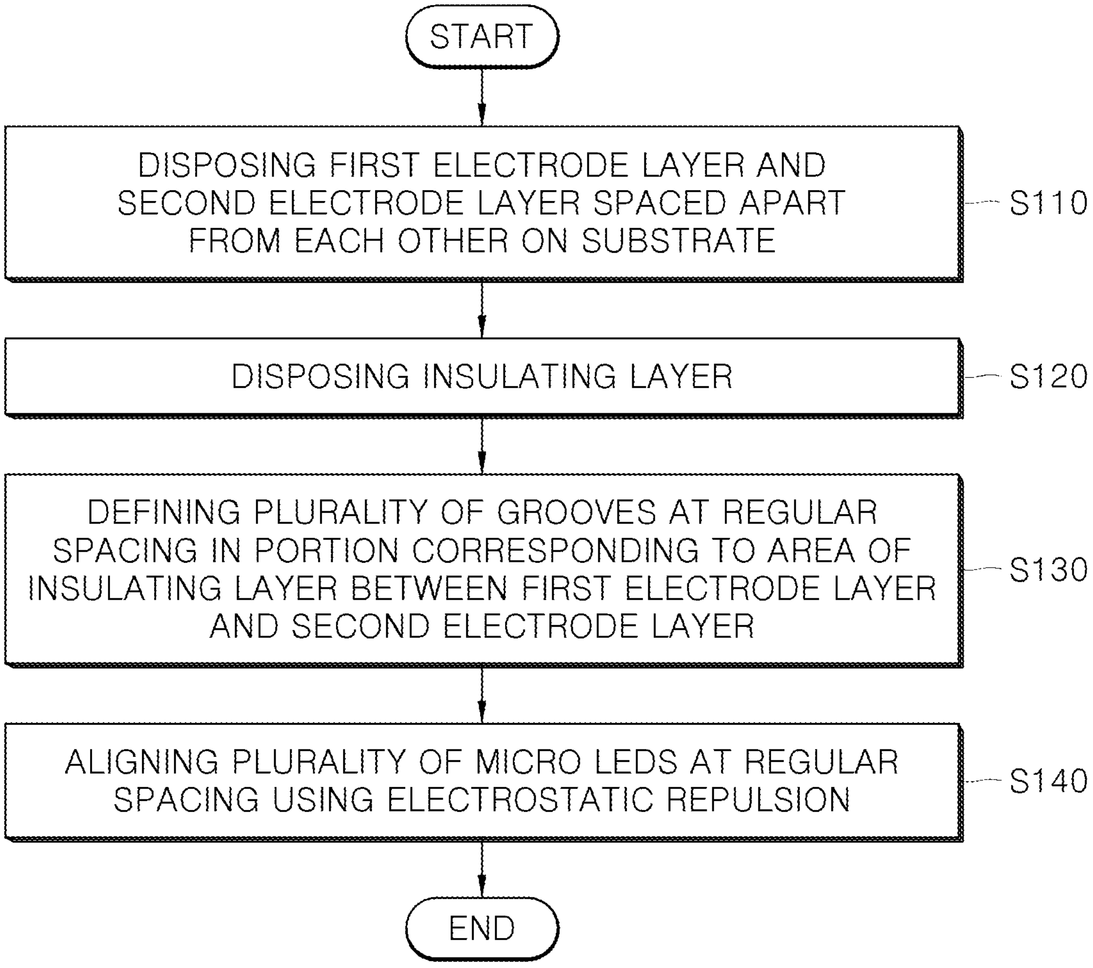
FIG. 1 is a flowchart of a micro LED alignment method using an electrostatic repulsion according to the present disclosure.

10: substrate
20: metal layer
22: first electrode layer
24: second electrode layer
30: insulating layer
40: photoresist
ML: micro LED
GA: first area
LAA: groove

DETAILED DESCRIPTIONS

The above-mentioned purpose, features and advantages are described in detail later with reference to the attached drawings, and accordingly, a person skilled in the art in the technical field to which the present disclosure belongs will be able to easily implement the technical idea of the present disclosure. When describing the present disclosure, upon determination that a detailed description of a known element related to the present disclosure may unnecessarily obscure the gist of the present disclosure, the detailed description thereof is omitted. Hereinafter, preferred embodiments according to the present disclosure will be described in detail with reference to the attached drawings. In the drawings, identical reference numerals are used to indicate identical or similar components.

Hereinafter, a first component being disposed "on top of (or under)" a second component may mean that the first component may be disposed in contact with a top surface (or a bottom surface) of the second component, as well as a third component may be interposed between the second component and the first component disposed "on top of (or under)" the second component.

Furthermore, when a first component is described as being "connected" or "coupled" to a second component, the components may be directly connected or coupled to each other, but a third component may be "interposed" between the components or the components may be "connected" or "coupled" to each other via the third components.

Hereinafter, a method for aligning micro LEDs using an electrostatic repulsion and a method for manufacturing a micro LED display using the same according to some embodiments of the present disclosure will be described.

The present disclosure is a technology that, when grooves in a trench structure are defined at a regular spacing in a portion corresponding to an area of an insulating layer between a first electrode layer and a second electrode layer and an electric field is generated, aligns the micro LEDs at precise locations as the electric field is formed between the first electrode layer and the second electrode layer and the plurality of micro LEDs dispersed in a solution are located in the grooves that generate the strongest electric field.

In particular, in the process of generating the electric field in the electrode layer, a magnitude of polarization that occurs in the plurality of micro LEDs varies depending on a magnitude of an alternating current signal. As the polarization occurs, electrostatic charges are generated in the micro LEDs, and a magnitude of the electrostatic repulsion between the plurality of micro LEDs varies depending on the magnitude of the polarization.

In the present disclosure, as the grooves are defined at the regular spacing within a range of the electrostatic repulsion between the plurality of micro LEDs, the electrostatic repulsion may affect the entire micro LEDs, thereby further improving a yield of an assembly.

Furthermore, in the present disclosure, as the plurality of micro LEDs are disposed in the plurality of grooves within the range of the electrostatic repulsion between the plurality of micro LEDs, the electrostatic repulsion may affect the entire micro LEDs, thereby further improving the yield of the assembly.

Furthermore, the technology to align the micro LEDs at the precise locations may utilize an interaction between the electric field and the micro LEDs, a movement of the micro LED in the solution, which is a fluid, and the like. The movement of the micro LED may be adjusted depending on a frequency of an applied AC voltage, a type of solution, and a type of micro LED.

In the present disclosure, a micro LED ML is an ultra-small light-emitting element whose longest side has a length equal to or smaller than approximately 100 μm. The micro LED ML may be made of one or more types of organic and inorganic materials dispersed in the solution, and may have various sizes of a 1D, 2D, or 3D shape.

For example, the micro LED ML may be in a form of a nanowire with a length, a flat disk, or a cube with an aspect ratio of 1 to 2.

Preferably, the micro LED ML may have a length in a range of 0.1 to 80 μm, more preferably in a range of 0.1 to 60 μm, and even more preferably in a range of 0.1 to 30 μm.

The micro LED in the form of the nanowire may have a cross-sectional diameter in a range of approximately 0.01 to 20 μm, preferably in a range of 0.1 to 10 μm. Furthermore, the micro LED in the form of the nano wire may have a relatively high aspect ratio, and the aspect ratio may be in a range of approximately 1 to 10. The micro LED with the high aspect ratio has a large surface area, so that energy transfer and performance thereof are excellent and transparency thereof is high.

In the present disclosure, a description will be made under the assumption that the micro LED is in the form of the nanowire.

The micro LED ML includes an n-type semiconductor layer, an active layer, and a p-type semiconductor layer, which is the same as a configuration of a commonly used LED, so that a detailed description thereof will be omitted.

A method for aligning the micro LEDs according to a first embodiment of the present disclosure may include disposing the first electrode layer and the second electrode layer spaced apart from each other on a substrate, disposing the insulating layer on the substrate on which the first electrode layer and the second electrode layer are disposed, defining the grooves in the insulating layer corresponding to the area between the first electrode layer and the second electrode layer, and applying an electric signal to the first electrode layer and the second electrode layer and generating the electric field with a non-uniform magnitude while supplying the solution containing the micro LEDs onto the substrate to align the micro LEDs in the grooves, wherein one micro LED may be aligned in one groove.

Referring to FIG. 1, a method for aligning the micro LEDs according to a second embodiment of the present disclosure may include disposing the first electrode layer and the second electrode layer spaced apart from each other on the substrate (S110), disposing the insulating layer (S120), defining the plurality of grooves at the regular spacing in the portion corresponding to the area of the insulating layer between the first electrode layer and the second electrode layer (S130), and aligning the plurality of micro LEDs at the regular spacing using the electrostatic repulsion (S140).

In the present disclosure, a substrate 10 may be an active matrix backplane.

Figure 2A:
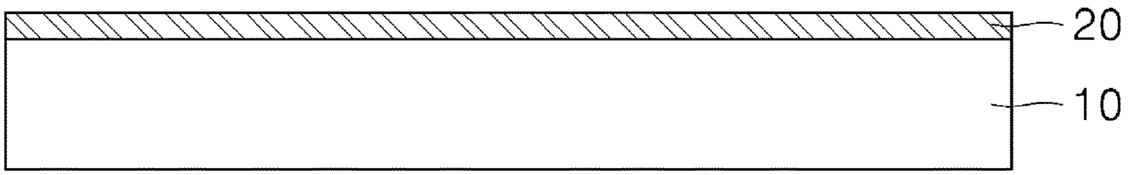
FIG. 2A is a cross-sectional view illustrating disposing a metal layer according to the present disclosure.
Figure 2B:
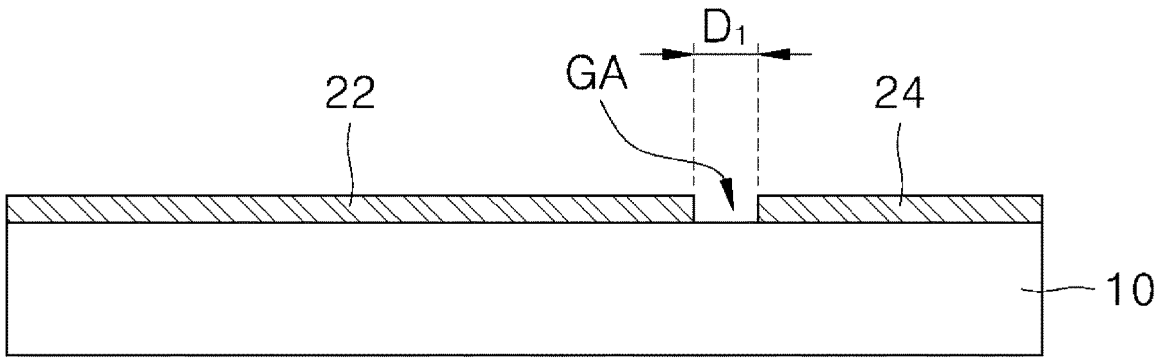
FIG. 2B is a cross-sectional view illustrating forming a first electrode layer and a second electrode layer.

First, as shown in FIGS. 2A and 2B, after disposing a metal layer 20 on the substrate 10, a portion corresponding to a first area GA of the metal layer 20 may be removed to form a first electrode layer 22 and a second electrode layer 24.

Specifically, a photoresist pattern may be formed on the metal layer 20 in an area excluding the first area GA, and etching may be performed on the formed photoresist pattern using an etch mask. By performing the etching, the first area GA of the metal layer 20 may be removed, and the first electrode layer 22 and the second electrode layer 24 spaced apart from each other may be formed on the substrate 10.

A thickness of the first electrode layer 22 and the second electrode layer 24 may be in a range of 10 nm to 100 nm, but the present disclosure may not be limited thereto.

In general, a display circuit requires a lot of metal wiring because the micro LEDs must be connected to electrodes. Accordingly, a parasitic electric field may be formed in an unwanted area during the micro LED assembly process using the electric field, so that it is important to minimize such phenomenon.

To this end, as shown in FIG. 2A, it is desirable to form the metal layer 20 over an entire area to cover all elements of the circuit. The metal layer may serve as an electric field shielding layer and align the LEDs. Furthermore, when the metal layer is formed over the entire area of the substrate, the formation of the parasitic electric field may be minimized and at the same time, the elements under the metal layer may be protected from the electric field. The first electrode layer and the second electrode layer formed from the metal layer may generate the electric field.

Figure 3:
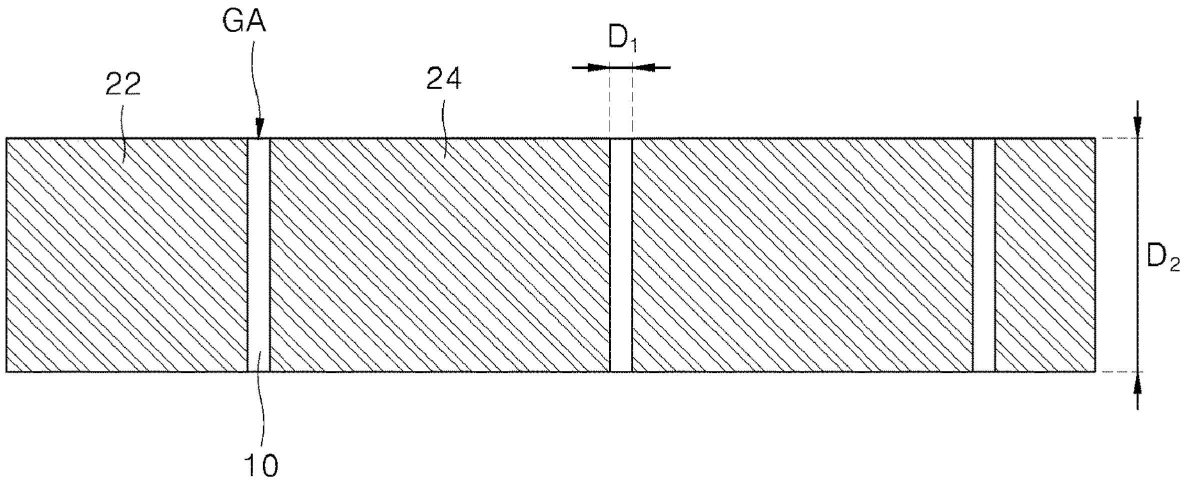
FIG. 3 is a top view of a first electrode layer and a second electrode layer according to the present disclosure.

As shown in FIGS. 2B and 3, the first area GA may be in a form of a ditch having a rectangular structure.

FIG. 3 is a top view showing the metal layer 20 patterned after being formed, and the metal layer 20 is shown as the first electrode layer 22 and the second electrode layer 24.

Figure 4A:
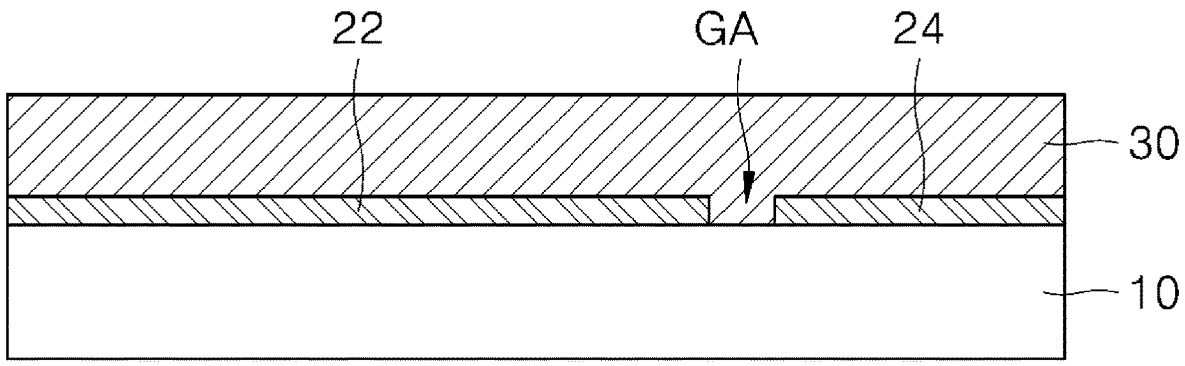
FIGS. 4A and 4B are cross-sectional views illustrating forming an insulating layer including a groove defined therein according to the present disclosure.

Thereafter, as shown in FIG. 4A, an insulating layer 30 may be disposed to cover all of the substrate 10, the first electrode layer 22, and the second electrode layer 24.

Figure 4B:
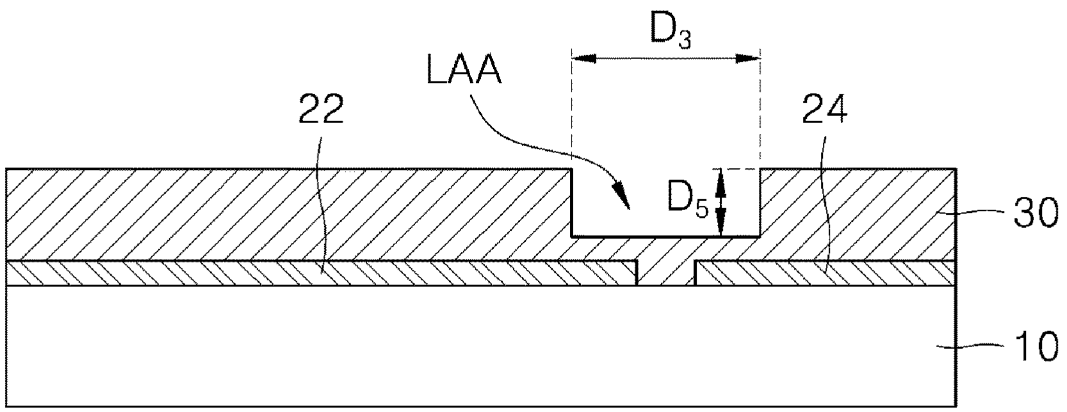

In addition, as shown in FIG. 4B, a plurality of grooves LAA may be defined at a regular spacing in a portion of the insulating layer 30 corresponding to the area GA between the first electrode layer and the second electrode layer. The portion of the insulating layer 30 corresponding to the first area GA, which is the area between the first electrode layer 22 and the second electrode layer 24, may be patterned to have a certain thickness, so that the groove LAA for inducing the formation of the electric field with the non-uniform magnitude on the substrate 10 may be formed.

Patterning the insulating layer means not removing all of the insulating material corresponding to the groove LAA, but leaving the material by a predetermined thickness.

For example, as an insulating material is further applied onto the insulating layer 30 and patterned, partial patterning that allows the insulating material corresponding to the groove LAA to be patterned more may be performed.

The patterning may be performed using exposure and development, or may be performed using dry etching or wet etching.

The grooves LAA may be defined at the regular spacing in a longitudinal direction of the first area in the first area GA(length D2) between the electrode layers 22 and 24.

When the groove LAA is defined above the electrode layers 22 and 24, a relatively intense electric field is formed in the groove LAA and a strong attraction is generated in the corresponding portion, making the alignment of the micro LEDs easier. As the electric field with the non-uniform magnitude is formed around the electrode layers, the micro LEDs are attracted or repelled.

Compared to an area that is not the groove LAA, the groove LAA area is closer to the electrode layers 22 and 24, so that an intensity of the electric field locally increases in the groove LAA area.

Such electric field with the non-uniform magnitude means that an intensity (a magnitude) of the electric field in the groove area and an intensity of the electric field in the non-groove area are different from each other.

Figure 5:
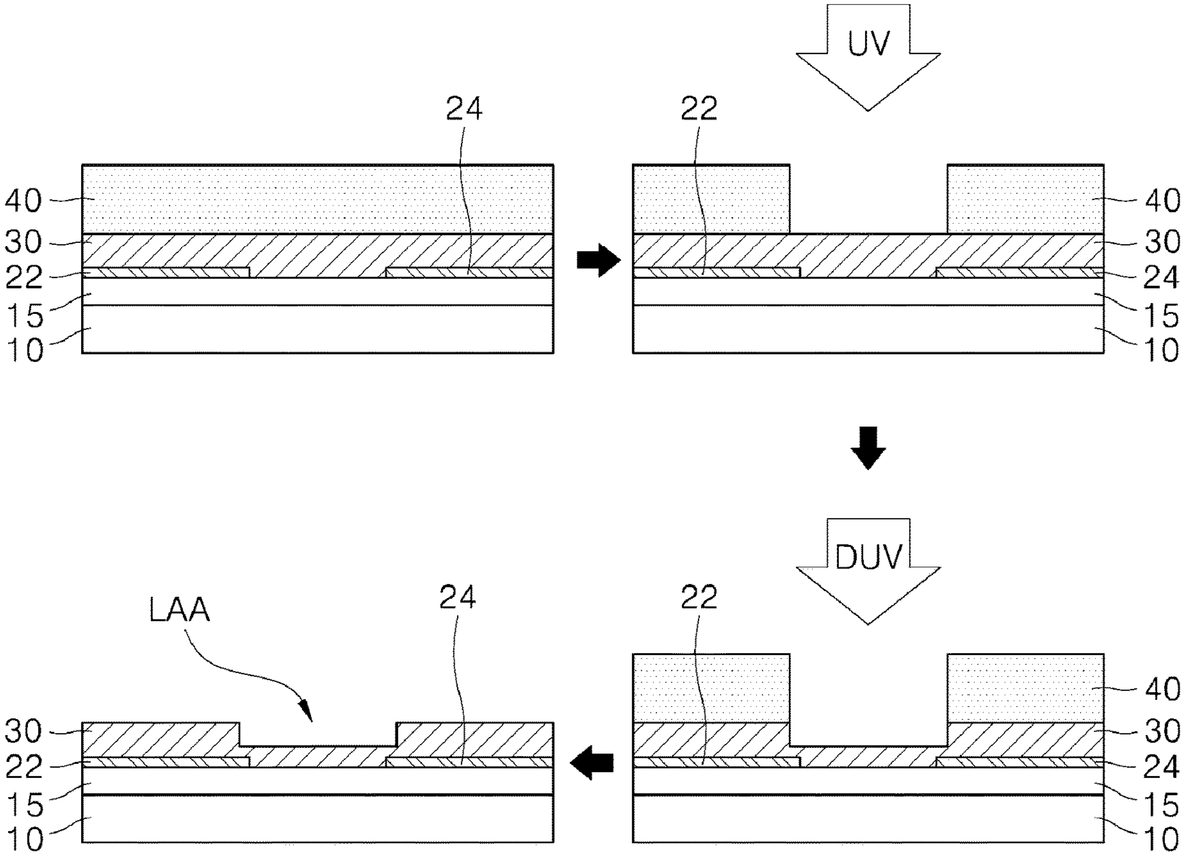
FIG. 5 is a flowchart of a process of defining a groove of an insulating layer according to the present disclosure.

Via a process shown in FIG. 5, the groove LAA may be defined in the insulating layer. The polymer-based insulating layer 30 may be deposited on the substrate 10 on which an insulating layer 15 such as $SiO_2$ is formed, and a photoresist (PR) 40 may be applied onto the insulating layer 30.

The insulating layer 30 may be made of one or more types of polymer-based organic and inorganic materials.

The insulating layer 30 may be applied to have a thickness in a range of approximately 100 to 400 nm, but the present disclosure may not be limited thereto.

Thereafter, first UV may be irradiated onto the photoresist 40 to primarily pattern the portion of the photoresist corresponding to the first area GA between the first electrode layer 22 and the second electrode layer 24.

The photoresist is a photosensitive liquid that is sensitive to light and contains an organic solvent and a polymer substance. After spin-coating the photoresist, the organic solvent in the photoresist may be removed. The photoresist uses light to form a pattern and is classified into negative and positive photoresists. The negative PR causes particles to clump together when exposed to light, so that a portion that has not received light when exposed to light is removed. The positive PR breaks a polymer bond when exposed to light, so that only a portion that has received light when exposed to light is removed.

When a mask (not shown) is disposed on the photoresist and then the UV is irradiated (UV exposure), the coated photoresist reacts.

FIG. 5 shows that the photoresist 40 is used as the mask for the purpose of patterning a portion of the insulating layer 30 into the trench structure. Further, because the positive PR is used, it is shown that the portion that has received light is removed to leave the pattern.

It is necessary to selectively etch the area where the photoresist has reacted.

As the etching, sputter etching using an inert gas, ions, and the like, dry etching such as plasma etching, or wet etching using a chemical reaction using a solution may be used.

Next, second UV may be irradiated to the primarily patterned area to secondarily pattern the portion of the insulating layer 30 corresponding to the first area GA with a constant thickness.

In FIG. 5, it is shown that deep UV (DUV) is irradiated in the secondary patterning, but the present disclosure is not limited thereto. The UV may have a wavelength in a range of approximately 300 to 400 nm, but the present disclosure may not be limited thereto. The DUV, as the deep UV, may exhibit an ultraviolet ray intensity greater than that of the UV.

Figure 6:
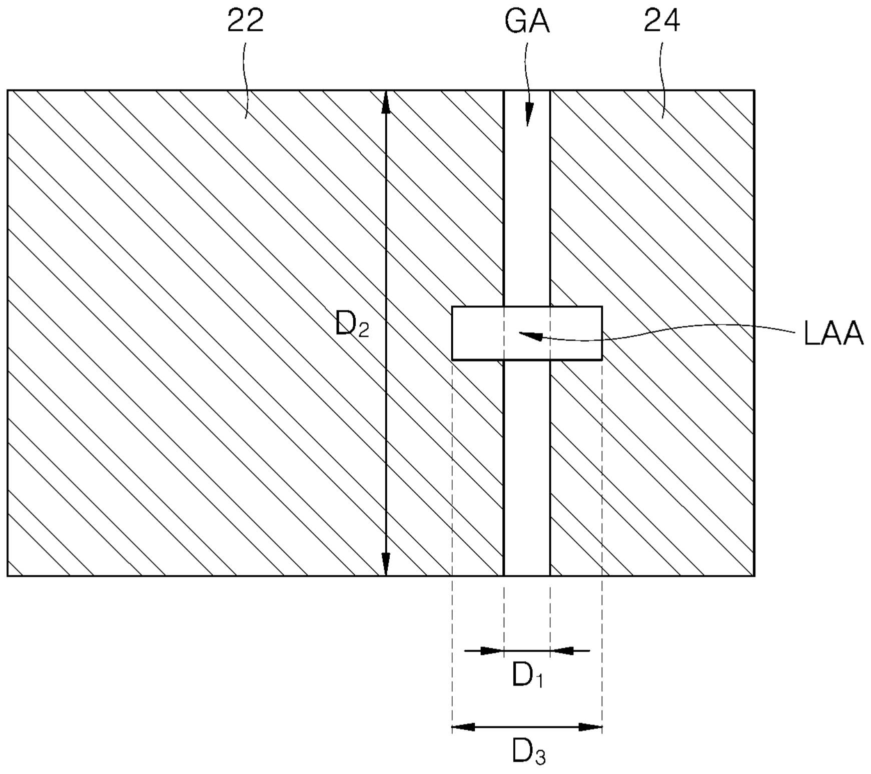
FIG. 6 is a top view of a groove of an insulating layer according to the present disclosure.

As shown in FIG. 6, the groove LAA may overlap the first area GA.

The LED display has a structure in which the plurality of grooves LAA are defined throughout the insulating layer at the regular spacing along the longitudinal direction of the first area GA.

The magnitude of the electric field in the groove LAA is greater than the magnitude of the electric field in the area other than the groove LAA, so that the intensity of the electric field increases locally in the groove LAA.

Accordingly, the electric field may be formed intensively in the groove LAA.

When a voltage is applied to generate the electric field with the non-uniform magnitude, a coupling phenomenon between the micro LED ML and the electrode layers 22 and 24 by a coupling capacitor occurs.

The coupling capacitor is a phenomenon in which electrodes at both ends of the capacitor have the same voltage level and are charged with opposite polarity.

Specifically, when the electric field is applied to the electrode layers 22 and 24 and the plurality of micro LEDs are assembled, charges of the micro LEDs are induced by the coupling capacitor, and an interaction of the charges generates a repulsion between the micro LEDs ML. Because the micro LED itself is a single moving electrode, the plurality of micro LEDs exhibit the same polarity and repel each other on the substrate. As the micro LEDs ML dispersed in the solution are located in the grooves LAA, where the electric field is relatively strong, the micro LEDs may be arranged at the precise locations at the regular spacing.

Figure 7:
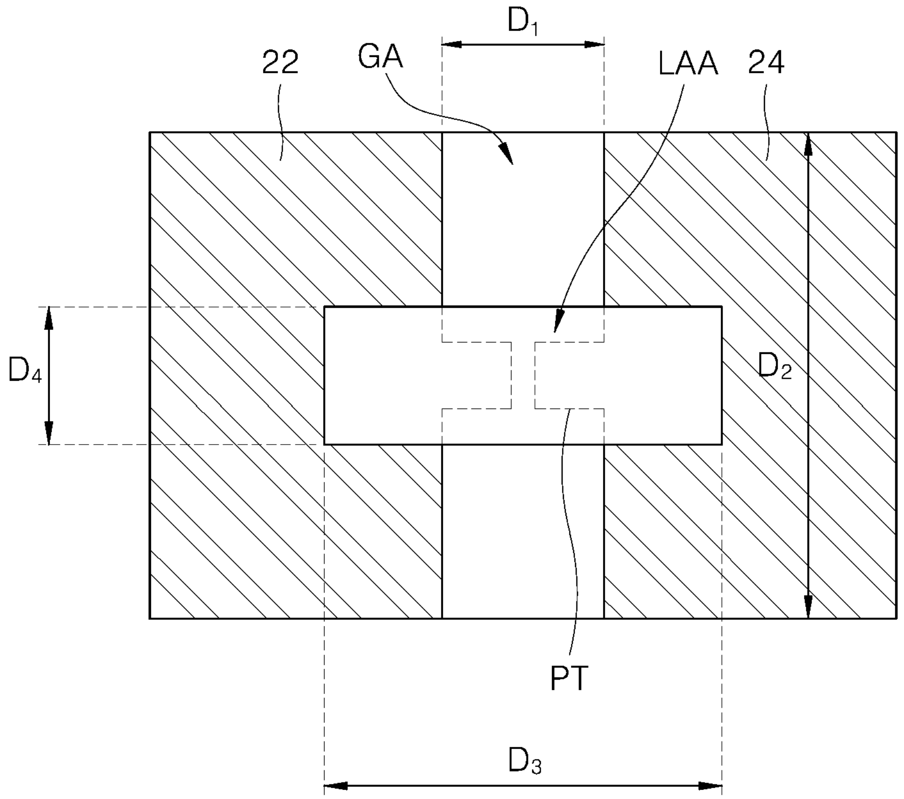
FIG. 7 is a top view of a groove including a protrusion according to the present disclosure.

As shown in FIG. 7, portions of the first electrode layer 22 and the second electrode layer 24 located in the groove LAA area may be arranged to protrude toward each other.

In other words, in the groove LAA area, each of the first electrode layer 22 and the second electrode layer 24 may include a protrusion PT. When there is the protrusion PT, the electric field may be intensively formed in the groove LAA during the aligning of the micro LEDs, so that the micro LED ML may be accurately aligned inside the groove LAA.

As shown in FIG. 6, a length $D_3$ of the groove LAA and a distance $D_1$ of the first area GA may be adjusted within a range that allows smooth alignment of the micro LEDs.

It is desirable that the length $D_3$ of the groove LAA is greater than the distance $D_1$ of the first area GA.

As the length $D_3$ of the groove LAA is greater than the distance $D_1$ of the first area GA, the magnitude of the electric field may be increased locally and the advantage of selectively assembling the micro LEDs may be obtained.

For example, the length $D_3$ of the groove LAA may be 0.1 times or more greater than the distance $D_1$ of the first area GA. The distance $D_1$ of the first area GA may be in a range of approximately 1 to 3 μm, but the present disclosure may not be limited thereto.

Figure 8:
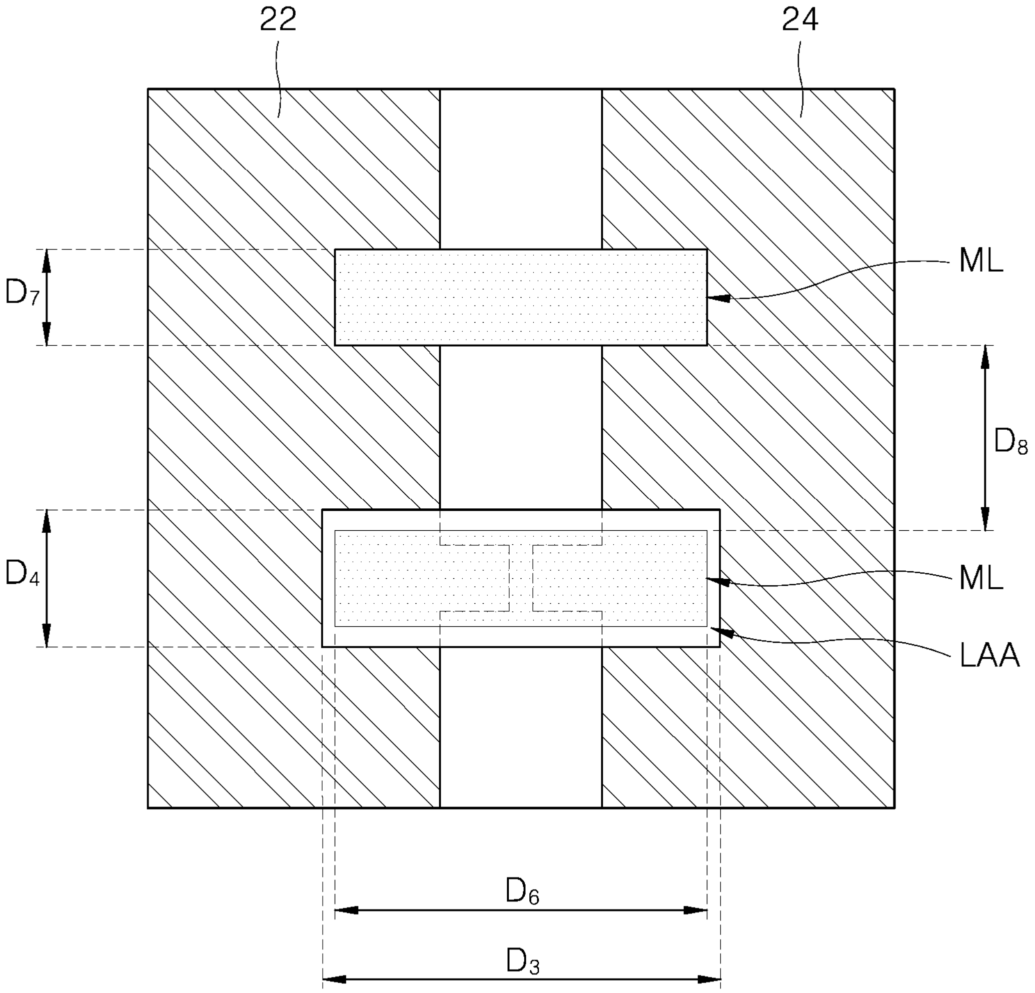
FIG. 8 is a top view showing micro LEDs aligned in grooves of an insulating layer when an electrostatic repulsion occurs, according to the present disclosure.

As shown in FIGS. 7 and 8, the groove LAA is a space where the micro LED ML is disposed, and it is preferable that the size of the groove LAA is greater than the size of the micro LED ML.

To align the one micro LED ML in the one groove LAA, the length $D_3$ of the groove LAA may be greater than a length $D_6$ of the micro LED and equal to or smaller than twice the length $D_6$ of the micro LED.

A width $D_4$ of the groove may be greater than a diameter $D_7$ of the micro LED and equal to or smaller than twice the diameter $D_7$ of the micro LED.

Furthermore, when the repulsion is generated between the plurality of micro LEDs by generating the electric field with the non-uniform magnitude in the first electrode layer 22 and the second electrode layer 24, the width $D_4$ of the groove may be smaller than a spacing $D_8$ between one micro LED ML and another adjacent micro LED ML. When the width $D_4$ is greater than the spacing $D_8$, two or more micro LEDs may be disposed in the groove, so that it is preferable that the width $D_4$ is smaller than the spacing $D_8$.

This may be expressed as $D_6<D_3<2\ XD_6$, $D_7<D_4<2\ XD_7$, and $D_7<D_4<D_8$.

A shape of the groove LAA may be determined depending on the shape of the micro LED ML. For example, when the micro LED ML has an elongated structure with the aspect ratio equal to or greater than 1:10, the groove LAA may also have the elongated structure. When the micro LED is in the form of the disk or the cube with the relatively small aspect ratio of about 1:1, the groove LAA may also be in the form of the disk or the cube.

Furthermore, as shown in FIG. 8, it is preferable that the length $D_6$ of the micro LED is greater than the distance of the first area GA. When the length $D_6$ of the micro LED is greater than the distance of the first area GA, when viewed from a plane, one end of the micro LED may overlap the first electrode layer 22 and the other end of the micro LED may overlap the second electrode layer 24, so that the LED may be aligned on the electrode layer more rigidly.

When the electric field is generated, the micro LEDs ML may be spaced apart from each other by a certain distance because of the repulsion to form the spacing $D_8$ therebetween. The spacing $D_8$ between the plurality of micro LEDs may be adjusted by the electric field intensity, the coupling phenomenon between the micro LED ML and the electrode layers 22 and 24 caused by the coupling capacitor, and the repulsion between the micro LEDs ML.

Specifically, when the electric field is generated in the first electrode layer and the second electrode layer, the electrostatic repulsion occurs between the one micro LED and another adjacent micro LED assembled in an electrode gap. The plurality of micro LEDs assembled in the electrode gap by the electrostatic repulsion move on their own while located in the electrode gap, so that the plurality of micro LEDs may be aligned at the regular spacing. When viewed in the cross-sectional view, the electrode gap may include a portion above the area corresponding to the portion between the first electrode layer 22 and the second electrode layer 24, and may include the groove LAA.

In addition, when applying the alternating current signal for dielectrophoresis, the spacing between the grooves may be determined in proportion to the magnitude of the alternating current signal and in accordance with the magnitude of the repulsion generated between the plurality of micro LEDs. When the micro LEDs are aligned after determining the spacing, the yield and efficiency of the assembly may be further increased. As such, it is desirable to arrange the spacing between the grooves, the spacing between the micro LEDs, and the like within the range of the electrostatic repulsion of the plurality of micro LEDs.

The alternating current signal may be applied in a range of 0.1 to 200 V, and preferably in a range of 0.1 to 100 V. In this regard, the alternating current signal may be applied at a frequency in a range of 1 to 200 MHz, and preferably at a frequency in a range of 10 to 100 MHz.

As the frequency of the alternating current signal satisfies such range, the yield of the micro LED assembly may be further improved based on the magnitude of the repulsion proportional to the magnitude of the alternating current signal.

Figure 9B:
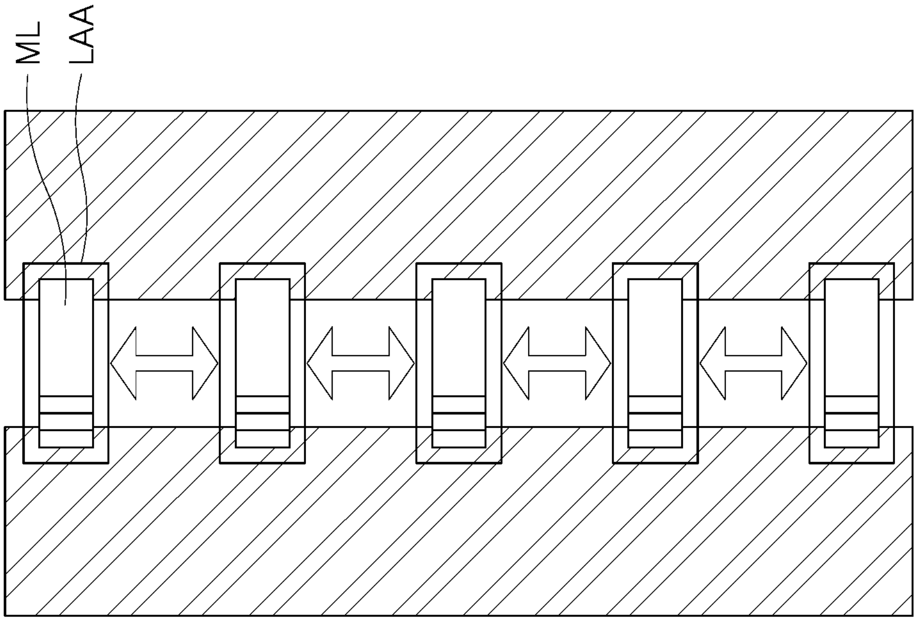
FIGS. 9A and 9B are top views of micro LEDs aligned based on a spacing between grooves of an insulating layer according to the present disclosure.
Figure 9A:
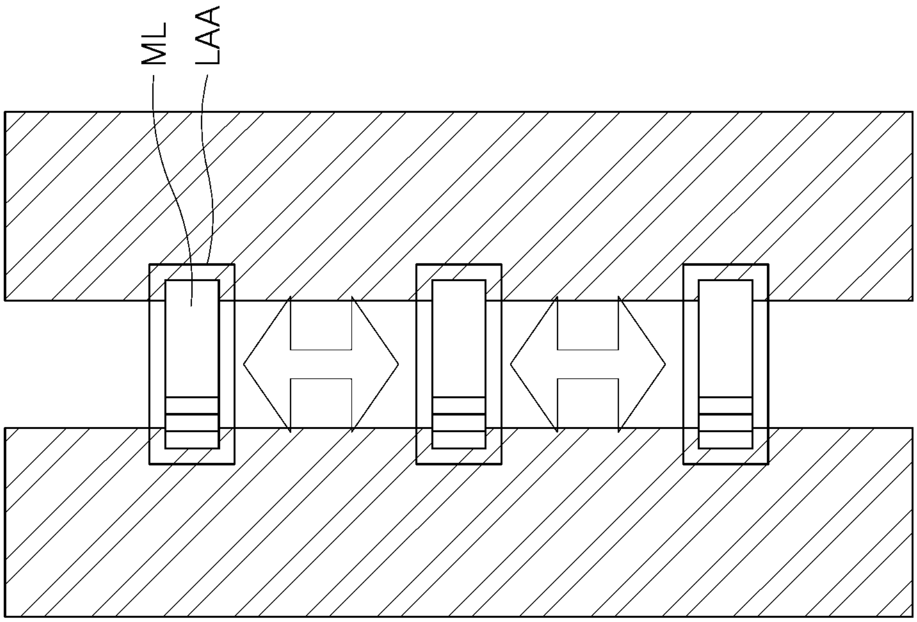

FIGS. 9A and 9B are plan views of micro LEDs aligned based on a spacing between grooves of an insulating layer according to the present disclosure.

As shown in FIG. 9A, when the spacing between the one groove and another adjacent groove is relatively great, a high alternating current signal may be applied. When the high alternating current signal is applied, a high polarization phenomenon occurs in the plurality of micro LEDs and a great repulsion occurs. When the repulsion occurs, the plurality of micro LEDs repel each other, and one micro LED is aligned in one groove. Ultimately, as the plurality of grooves are arranged at the regular spacing and the plurality of micro LEDs are aligned at the regular spacing within the range of the electrostatic repulsion, the assembly yield of the micro LEDs may be further increased.

As shown in FIG. 9B, when the spacing between the one groove and another adjacent groove is relatively small, more micro LEDs may be aligned, and at this time, a low alternating current signal may be applied. When the low alternating current signal is applied, a low polarization phenomenon occurs in the plurality of micro LEDs and a small repulsion occurs. When the repulsion occurs, the plurality of micro LEDs repel each other, and one micro LED is aligned in one groove. Ultimately, as the plurality of grooves are arranged at the regular spacing and the plurality of micro LEDs are aligned at the regular spacing within the range of the electrostatic repulsion, the assembly yield of the micro LEDs may be further increased.

To further increase the assembly yield of the micro LEDs within the range of the electrostatic repulsion, it is desirable that the spacing between the one groove and another adjacent groove is greater than the diameter $D_7$ of the micro LED. When the spacing between the grooves is greater than the diameter of the micro LED, the micro LEDs repel each other by the repulsion, making the alignment with respect to the grooves easier. Conversely, when the spacing between the grooves is smaller than the diameter of the micro LED, the grooves are located too close to each other, making it difficult to align the micro LEDs in the grooves by the repulsion and making it difficult to align the micro LEDs at the regular spacing.

Furthermore, it is desirable that the spacing $D_8$ between the one micro LED and another adjacent micro LED is greater than the diameter $D_7$ of the micro LED. When the spacing $D_8$ is greater than the diameter $D_7$, it is advantageous for the plurality of micro LEDs to be aligned at the regular spacing by the repulsion occurring between the plurality of micro LEDs. Conversely, when the spacing $D_8$ is smaller than the diameter $D_7$, as the micro LEDs are aligned at a too small spacing, the micro LEDs are aligned in non-uniform directions.

For example, the spacing $D_8$ between the one micro LED and another adjacent micro LED may be in a range of 0.1 to 30 μm, preferably in a range of 0.1 to 20 μm, and more preferably in a range of 0.1 to 10 μm.

In a range where the spacing $D_8$ is in the range of 0.1 to 30 μm and the diameter $D_7$ is in a range of 0.01 to 20 μm, the spacing $D_8$ may be larger than the diameter $D_7$.

Furthermore, the spacing $D_8$ between the one micro LED and another adjacent micro LED may be 0.05 to 5 times, and preferably 0.1 to 3 times the length $D_6$ of the micro LED. Because the spacing $D_8$ satisfies 0.05 to 5 times the length $D_6$, the micro LEDs are aligned at the regular spacing by the repulsion between the plurality of micro LEDs.

For example, when the length $D_6$ is 10 μm and the spacing $D_8$ is 3 times the length $D_6$, the spacing $D_8$ may be 30 μm.

Figure 10B:
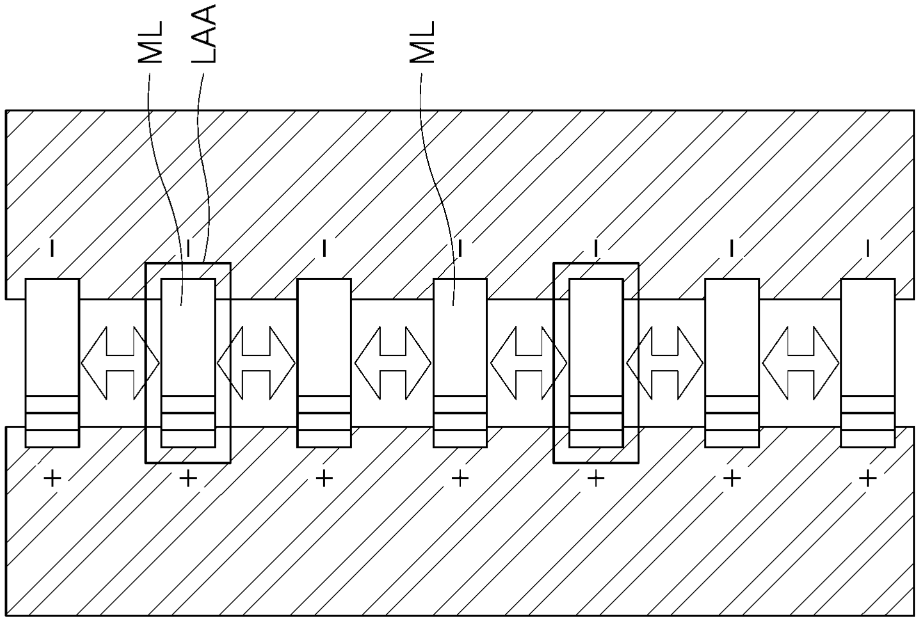
FIGS. 10A and 10B are top views of micro LEDs aligned based on whether an electrostatic repulsion occurs, according to the present disclosure.
Figure 10A:
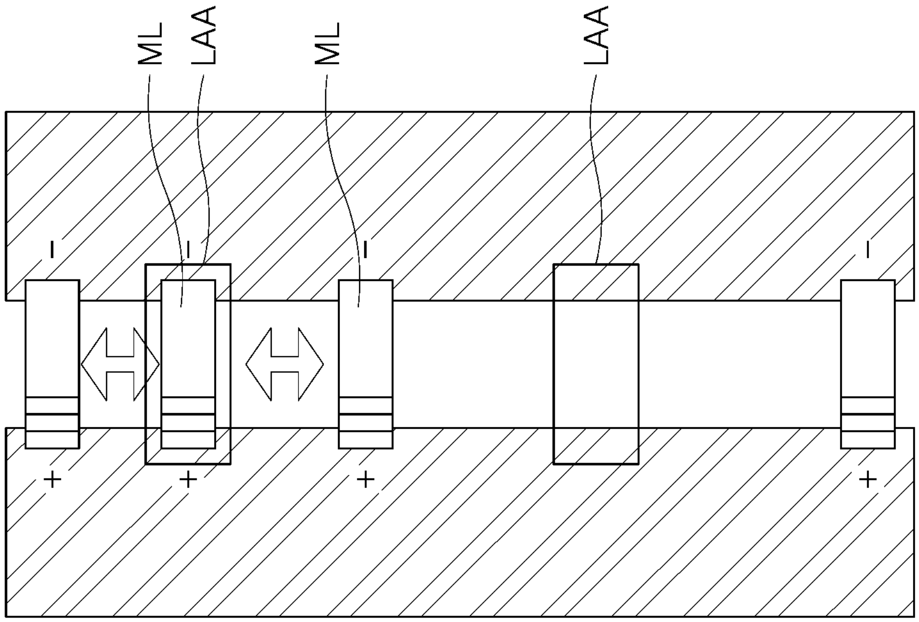

FIGS. 10A and 10B are plan views of micro LEDs aligned based on whether an electrostatic repulsion has occurred according to the present disclosure.

As shown in FIGS. 10A and 10B, as the electrostatic charges based on the polarization are generated, the electrostatic repulsion occurs between the plurality of micro LEDs. In the aligning of the plurality of micro LEDs using the electrostatic repulsion, at least one micro LED may be further aligned at a regular spacing between the one groove and another adjacent groove. In other words, the micro LEDs may be aligned at the regular spacing even in the area other than the groove.

In this regard, one micro LED aligned at a bottom in FIG. 10A is a single micro LED, so that the electrostatic charges resulted from the polarization are formed, but are not able to exert the electrostatic repulsion on other micro LEDs, and it is shown that the plurality of micro LEDs are irregularly aligned on the substrate.

In one example, in the structure in which the one micro LED ML is disposed in the one groove LAA, when the plurality of, 2 to 3, grooves constitute one set and the micro LEDs ML are electrically connected to each other, a defect that occurs when the one micro LED ML is disposed in the one groove LAA may be solved.

Figure 11:
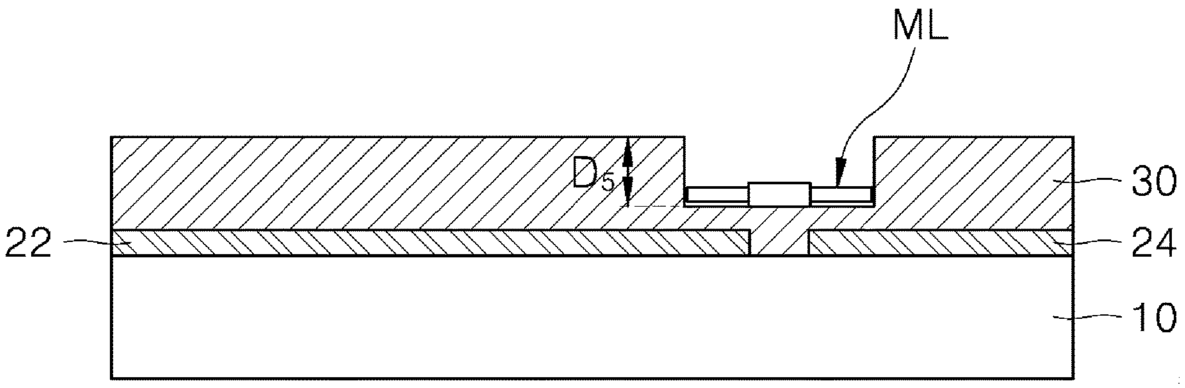
FIG. 11 is a cross-sectional view of a micro LED aligned in a groove of an insulating layer according to the present disclosure.

As shown in FIG. 11, a depth 4:15 of the groove LAA is related to a distance between the micro LED and the electrode layers 22 and 24. Even with the same thickness of the insulating layer 30, the greater the depth of the patterned portion, that is, the depth 4:15 of the groove LAA, the closer the micro LED ML may be aligned to the electrode layers 22 and 24.

Depending on the depth $d_5$ of the groove LAA, the micro LED ML may exist in a strongly held or fixed state within the groove LAA. For example, the depth $d_5$ of the groove LAA may be equal to or greater than ⅓ of the diameter $D_7$ of the micro LED ML.

Although the micro LEDs ML may be arranged without the insulating layer 30 and the grooves LAA, the micro LEDs ML are destroyed as a high current flows at the moment of arrangement.

Furthermore, when there is no insulating layer 30 on the electrode layers 22 and 24, a short may occur as the micro LEDs are arranged between the electrode layers 22 and 24.

Accordingly, it is necessary to form the insulating layer 30 directly on the electrode layers 22 and 24 or to form the insulating layer 30 on an entirety of the substrate and then define the groove LAA with a small thickness locally.

When the thickness of the insulating layer 30 between the groove LAA and electrode layers 22 and 24 is too great, the intensity of the electric field tends to decrease in the area GA between the electrode layers, so that it is desirable that the insulating layer 30 has an appropriate thickness. For example, the thickness of the insulating layer 30 between the groove LAA and the electrode layers 22 and 24 may be in a range of approximately 0.01 to 1 μm, specifically in a range of 0.1 to 1 μm, but the present disclosure may not be limited thereto.

Figure 12:
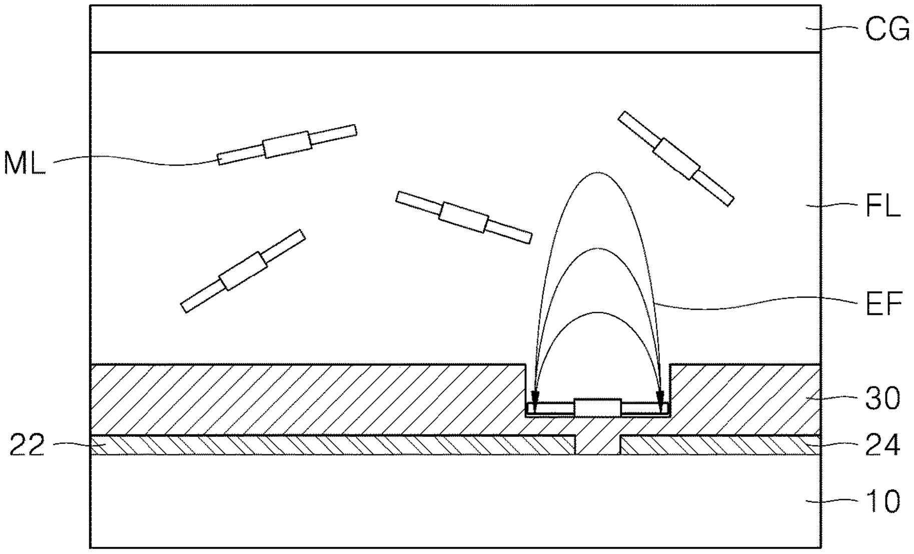
FIG. 12 is a cross-sectional view illustrating aligning micro LEDs according to the present disclosure.

As shown in FIG. 12, while supplying the solution containing the plurality of micro LEDs ML onto the substrate 10, the electric field may be generated in the first electrode layer 22 and the second electrode layer 24 to align the micro LED at the precise location of the groove LAA. In addition, the one micro LED ML may be aligned in the one groove LAA.

The solution containing the plurality of micro LEDs may contain $1\times10^3$ to $1\times10^7$ micro LEDs for each 1μℓ of the solution, and preferably, may contain $1\times10^4$ to $1\times10^6$ micro LEDs. As $1\times10^3$ to $1\times10^7$ micro LEDs are contained for each 1μℓ of the solution, the plurality of micro LEDs may be aligned at the regular spacing without empty grooves.

A solution FL may be a liquid having a lower dielectric constant than the micro LED ML when an electric signal is applied by an electric signal supply (not shown).

The solution FL may be a liquid including at least one among isopropyl alcohol, acetone, toluene, ethanol, methanol, and distilled water.

While the solution containing the plurality of micro LEDs ML is supplied onto the substrate 10, the electric signal supply may apply the electric signal to the first electrode layer 22 and the second electrode layer 24 to form an electric field EF between the first electrode layer 22 and the second electrode layer 24.

When the electric field EF is generated, at least one of the plurality of micro LEDs ML contained in the solution may be arranged in the groove LAA by an attraction of the electric field EF.

To ensure that the arrangement direction of the micro LED ML in the groove LAA is constant, the electric signal supply may supply a direct current signal, an alternating current signal, or a pulsed DC signal to the first electrode layer 22 and the second electrode layer 24, and preferably, supply the alternating current signal or the pulsed DC signal.

In this regard, the pulsed DC signal refers to a periodic electrical signal whose value changes but whose polarity remains constant. The electric signal supply may generate the pulsed DC signal by adding a bias direct current signal to the alternating current signal.

Figure 13A:
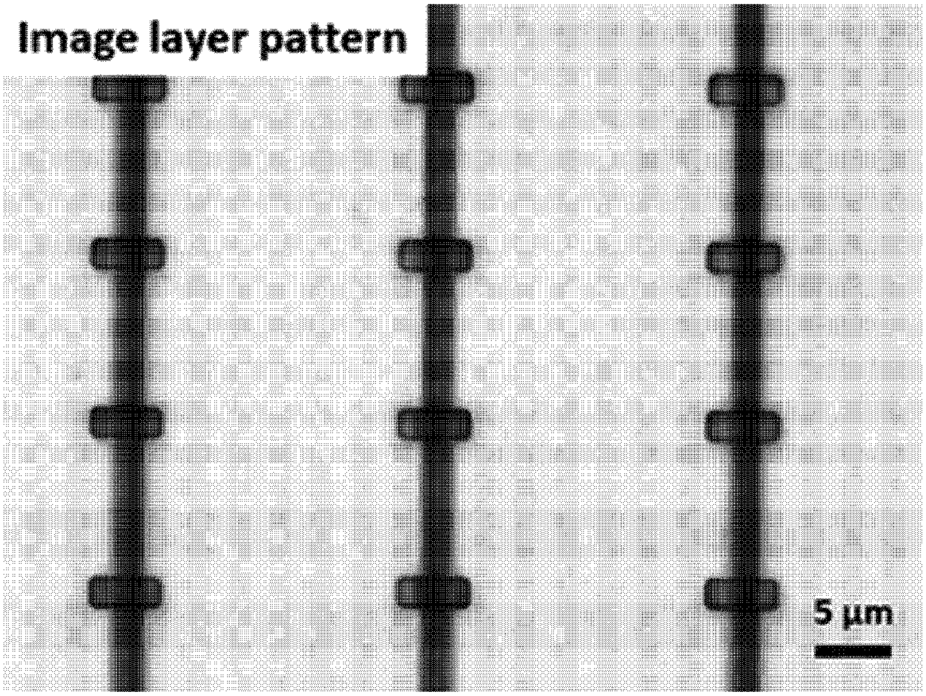
FIGS. 13A and 13B are images in which insulating layer-based grooves are applied at a regular spacing, according to the present disclosure.
Figure 13B:
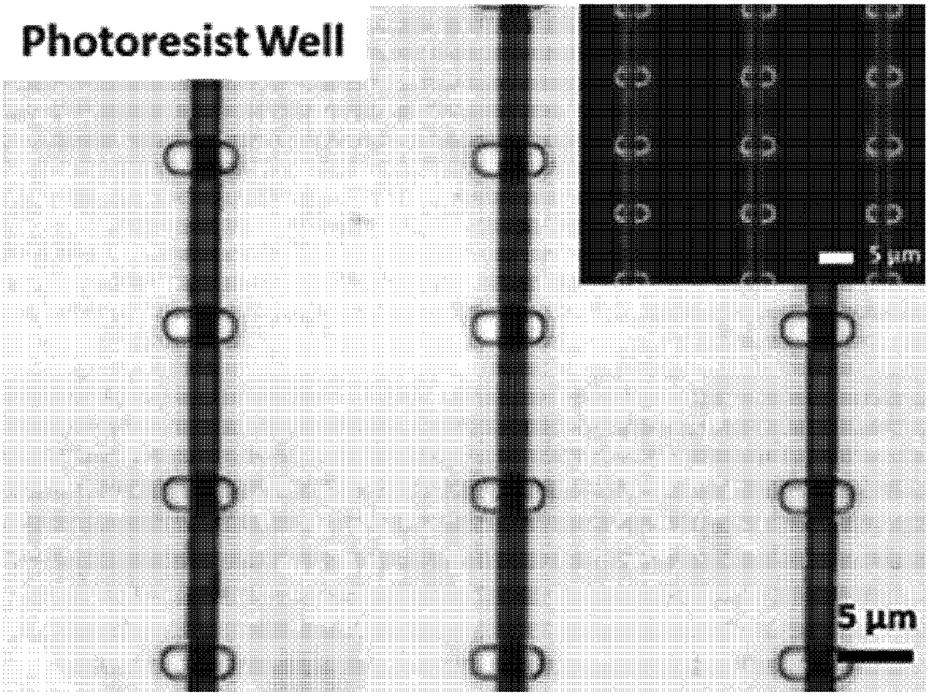
Figure 14:
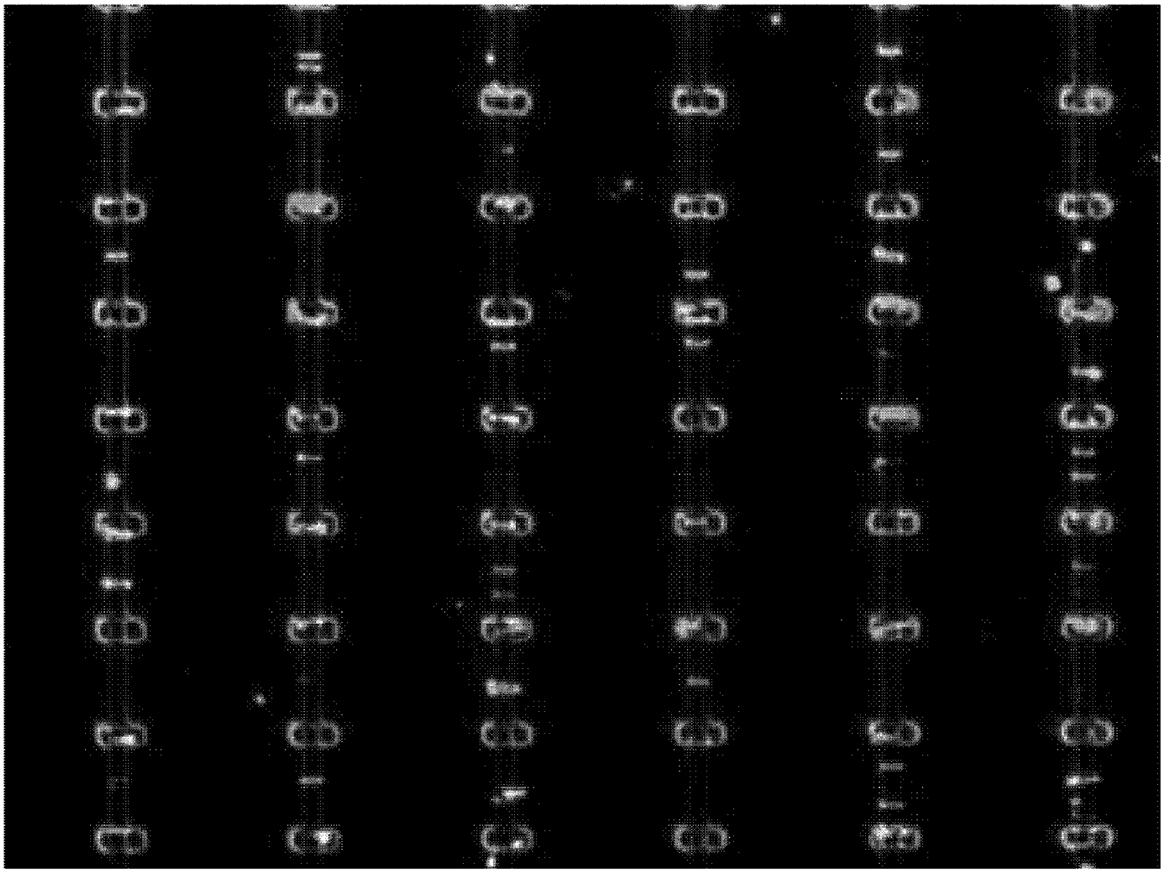
FIG. 14 is a photo of micro LEDs aligned at a regular spacing in grooves of an insulating layer according to the present disclosure.

FIGS. 13A and 13B are images of applying grooves based on an insulating layer according to the present disclosure, and FIG. 14 is a photograph of micro LEDs aligned in grooves according to the present disclosure.

Referring to FIGS. 13A, 13B, and 14, as the electric field with the non-uniform magnitude is formed on the substrate, an error range for the location may be reduced to be equal to or smaller than 0.1 μm, so that the micro LEDs may be aligned at the precise locations. Furthermore, the plurality of micro LEDs may be aligned at the regular spacing and the high assembly yield may be achieved.

After the aligning of the micro LEDs, removing all of the insulating layer 30 may be further included. When necessary, the insulating layer may be maintained on the substrate.

When all of the insulating layer 30 is removed, one end of the micro LED ML may be electrically connected to the first electrode layer 22 and be physically fixed. The other end of the micro LED ML may be electrically connected to the second electrode layer 24 and be physically fixed.

As such, the present disclosure may use the electrostatic repulsion to align the plurality of micro LEDs at the regular spacing. Furthermore, by adjusting the intensity of the electric field to be locally strong in the groove, the micro LED may be aligned at the precise location.

When there are three types of micro LEDs ML1, ML2, and ML3, the three types of micro LEDs ML1, ML2, and ML3 may be aligned at a regular spacing at precise locations via three processes.

First, when mounting the first micro LEDs ML1, the electric signal supply supplies the electric signal to the first electrode layer and the second electrode layer while supplying the solution FL containing the first micro LEDs ML1. As the attraction occurs between the first electrode layer and the second electrode layer, the first micro LEDs ML1 may be mounted in the corresponding portion.

The electric signal supply may not supply the electric signal to a third electrode layer and a fourth electrode layer, or may supply the electric signal that prevents the attraction from occurring with the first electrode layer or the second electrode layer.

Thereafter, when mounting the second micro LEDs ML2, the electric signal supply supplies the electric signal to the second electrode layer and the third electrode layer while supplying the solution FL containing the second micro LEDs ML2. As the attraction occurs between the second electrode layer and the third electrode layer, the second micro LED ML2 may be mounted in the corresponding portion.

Finally, when mounting the third micro LED ML3, the electric signal supply supplies the electric signal to the third electrode layer and the fourth electrode layer while supplying the solution FL containing the third micro LEDs ML3. As the attraction occurs between the third electrode layer and the fourth electrode layer, the third micro LED ML3 may be mounted in the corresponding portion.

As such, in each assembly process, the electric field may be generated between the electrode layers of the area for mounting the corresponding micro LED, so that the plurality of micro LEDs may be aligned.

In the present disclosure, the micro LED display may be manufactured using the micro LED alignment method such that the one micro LED is disposed in each pixel area.

Specifically, the method for manufacturing the micro LED display is as follows.

A transistor TFT is disposed in each of the plurality of pixel areas defined as data lines and gate lines intersect each other on the substrate.

The transistor may be a thin film transistor using a relatively thin film. In the display, the transistor plays a role of adjusting brightness of each pixel that constitutes a display screen.

One pixel is composed of sub-pixels that render R, G, and B colors, and each sub-pixel requires a current for the display to render a color. The transistor is located in each sub-pixel, and when a specific voltage is applied, the pixel is driven with the corresponding amount of current.

The transistor is disposed at an intersection of the data line and the gate line.

The data line is connected to a source electrode of the transistor, and the gate line is connected to a gate electrode of the transistor.

The transistor is classified into an inverted stagger structure (a bottom gate type) and a stagger structure (a top gate type) based on a location of the gate electrode. Further, depending on arrangement of the gate electrode and the active layer, the transistor may be classified into four structures: 1) bottom gate-top contact, 2) bottom gate-bottom contact, 3) top gate-top contact, and 4) top gate-bottom contact.

The top gate structure is a form in which the gate electrode is disposed above a gate insulating film and the active layer is formed below the gate insulating film.

The bottom gate structure is a form in which the gate electrode is disposed below the gate insulating film and the active layer is formed above the gate insulating film.

The bottom contact structure is a form in which source and drain electrodes are formed before the active layer and a bottom surface of the active layer is in contact with the source and drain electrodes.

The top contact structure is a form in which the active layer is formed before the source and drain electrodes, and a top surface of the active layer is in contact with the source and drain electrodes.

The transistor in the present disclosure may be applied in any of the four structures.

Subsequently, the first electrode layer and the second electrode layer spaced apart from each other may be disposed on the substrate on which the transistor is disposed in each of the plurality of pixel areas. The micro LED ML may be disposed between and connected to the drain electrode of the transistor and a power supply voltage line $V_{DD}$.

Subsequently, the insulating layer may be disposed on the substrate on which the first electrode layer and the second electrode layer are disposed in each of the plurality of pixel areas.

Subsequently, the insulating layer corresponding to the area between the first electrode layer and the second electrode layer may be patterned for each of the plurality of pixel areas to have the certain thickness to define the plurality of grooves at the regular spacing.

For example, after applying the photoresist on the insulating layer for each of the plurality of pixel areas, the primary patterning and the secondary patterning may be performed to define the grooves.

Because the primary patterning and the secondary patterning are the same as described above, a description thereof will be omitted.

Subsequently, according to a first embodiment, while the solution containing the micro LEDs is supplied onto the substrate for each of the plurality of pixel areas, the electric signal may be applied to the first electrode layer and the second electrode layer and the electric field with the non-uniform magnitude may be generated to align the micro LEDs in the grooves.

Alternatively, according to a second embodiment, while the solution containing the micro LEDs is supplied onto the substrate for each of the plurality of pixel areas, the electric field may be generated in the first electrode layer and the second electrode layer to align the plurality of micro LEDs at the regular spacing by the repulsion occurring between the one micro LED and another adjacent micro LED.

Via such process, the one micro LED may be aligned in the one groove, and the one micro LED may be disposed in each pixel area.

After assembling the one micro LED in the one groove, connecting the first electrode layer to the source electrode or the drain electrode of the transistor, and connecting the second electrode layer to the power supply voltage line $V_{DD}$ or a base voltage line $V_{SS}$ may be further included.

Via the above connecting step, one end of the micro LED ML may be connected to the source electrode of the transistor and the other end of the micro LED ML may be connected to the power supply voltage line $V_{DD}$.

Additionally, the electrical signals may be sequentially applied to respective rows of a plurality of rows to arrange micro LEDs with different light emission characteristics, for example, nano or micro LEDs corresponding to the colors of R-G-B, as display pixels on a display backplane.

A circuit device that may individually apply the electric signals may be used to sequentially form the electric field for the respective rows.

To render RGB full colors by separately applying the electric field to each pixel, the micro LEDs may be arranged in a following manner, regardless of order.

While supplying a solution containing red micro LEDs among the plurality of micro LEDs, an electric signal may be applied to a first electrode layer and a second electrode layer connected to a red pixel to arrange the red micro LEDs at a regular spacing in grooves included in the red pixel, and the substrate (the backplane) may be dried.

While supplying a solution containing green micro LEDs among the plurality of micro LEDs, an electric signal may be applied to a first electrode layer and a second electrode layer connected to a green pixel to arrange the green micro LEDs at a regular spacing in grooves included in the green pixel, and the substrate (the backplane) may be dried.

While supplying a solution containing blue micro LEDs among the plurality of micro LEDs, an electric signal may be applied to a first electrode layer and a second electrode layer connected to a blue pixel to arrange the blue micro LEDs at a regular spacing in grooves included in the blue pixel, and the substrate (the backplane) may be dried.

As such, a full-color display may be completed by repeating the micro LED supply, the micro LED arrangement, and the drying process to form an R-G-B nano LED array on the display.

The micro LED display manufactured via the micro LED alignment method in the present disclosure may be applied to a small and high-resolution display, and may also be applied to a HMD for AR-VR and a HUD applied to a vehicle.

In addition, the micro LED display may be utilized in various fields such as an optical sensor, optical communication, semiconductor integration, a headlamp for the vehicle, a smart textile, a bio contact lens, and a light source for a wearable medical device.

The present disclosure has been described above with reference to illustrative drawings. However, the present disclosure is not limited to the embodiments and drawings disclosed in the present disclosure. It is obvious that various modifications may be made by those skilled in the art within the scope of the technical idea of the present disclosure. In addition, even when the effects of the composition of the present disclosure were not explicitly described and explained in the above description of the embodiments of the present disclosure, it is natural that the predictable effects from the composition should also be appreciated.

The invention claimed is:

1. A method for aligning micro LEDs, the method comprising:

(a) disposing a first electrode layer and a second electrode layer spaced apart from each other on a substrate;

(b) disposing an insulating layer on the substrate where the first electrode layer and the second electrode layer are disposed;

(c) defining a groove in the insulating layer corresponding to an area between the first electrode layer and the second electrode layer; and (d) applying an electric signal to the first electrode layer and the second electrode layer while supplying a solution containing the micro LEDs onto the substrate, and generating an electric field with a non-uniform magnitude to align the micro LED in the groove, wherein one micro LED is aligned in one groove, and
wherein each of a length of the groove and a length of the one micro LED is greater than a distance of the area between the first electrode layer and the second electrode layer.

2. The method of claim 1,
wherein in the (d), a spacing between the one micro LED and a further micro LED adjacent thereto is greater than a diameter of the micro LED.

3. The method of claim 1,
wherein the (d) includes further aligning at least one micro LED between one groove and a further groove adjacent thereto.

4. The method of claim 1,
wherein in the (d), the solution containing the plurality of micro LEDs contains $1\times10^3$ to $1\times10^7$ micro LEDs for each 1 μℓ of the solution.

5. The method of claim 1,
wherein a length of the groove is greater than a length of the micro LED.

6. The method of claim 1,
wherein a width of the groove is smaller than the spacing between the one micro LED and a further micro LED adjacent thereto when the repulsion occurs between the plurality of micro LEDs as the electric field is generated in the first electrode layer and the second electrode layer.

7. The method of claim 1,
wherein in the (d), a magnitude of the electric field in the groove is greater than a magnitude of the electric field in an area other than the groove.

8. The method of claim 1,
wherein the first electrode layer and the second electrode layer located in the groove area are arranged to protrude toward each other.

9. A method for aligning micro LEDs, the method comprising:
(a) disposing a first electrode layer and a second electrode layer spaced apart from each other on a substrate;
(b) disposing an insulating layer on the substrate where the first electrode layer and the second electrode layer are disposed;
(c) defining a plurality of grooves at a regular spacing in a portion of the insulating layer corresponding to an area between the first electrode layer and the second electrode layer; and
(d) generating an electric field in the first electrode layer and the second electrode layer while supplying a solution containing the plurality of micro LEDs onto the substrate to align the plurality of micro LEDs at a regular spacing by a repulsion occurring between one micro LED and a further micro LED adjacent thereto,
wherein the (d) includes aligning at least one micro LED in one groove, and
wherein each of a length of the groove and a length of the at least one micro LED is greater than a distance of the area between the first electrode layer and the second electrode layer.

10. The method of claim 9,
wherein in the (d), a spacing between the one micro LED and the further micro LED adjacent thereto is greater than a diameter of the micro LED.

11. The method of claim 9,
wherein the (d) includes further aligning at least one micro LED between one groove and a further groove adjacent thereto.

12. The method of claim 9,
wherein in the (d), the solution containing the plurality of micro LEDs contains $1\times10^3$ to $1\times10^7$ micro LEDs for each 1 μℓ of the solution.

13. The method of claim 9,
wherein a length of the groove is greater than a length of the micro LED.

14. The method of claim 9,
wherein a width of the groove is smaller than the spacing between the one micro LED and the further micro LED adjacent thereto when the repulsion occurs between the plurality of micro LEDs as the electric field is generated in the first electrode layer and the second electrode layer.

15. The method of claim 9,
wherein in the (d), a magnitude of the electric field in the groove is greater than a magnitude of the electric field in an area other than the groove.

16. The method of claim 9,
wherein the first electrode layer and the second electrode layer located in the groove area are arranged to protrude toward each other.

17. A method for manufacturing a micro LED display, the method comprising:
(a) disposing a transistor in each of a plurality of pixel areas defined as data lines and gate lines intersect each other on a substrate;
(b) disposing a first electrode layer and a second electrode layer spaced apart from each other in each of the plurality of pixel areas;
(c) disposing an insulating layer on the substrate where the first electrode layer and the second electrode layer are disposed;
(d) defining a groove in a portion of the insulating layer corresponding to an area between the first electrode layer and the second electrode layer; and
(e) applying an electric signal to the first electrode layer and the second electrode layer while supplying a solution containing a plurality of micro LEDs onto the substrate, and generating an electric field with a non-uniform magnitude to align one micro LED in one groove,
wherein one micro LED is disposed in each pixel area, and
wherein each of a length of the groove and a length of the one micro LED is greater than a distance of the area between the first electrode layer and the second electrode layer.

18. The method of claim 17, wherein the (e) further includes, for each of the plurality of pixel areas:
applying an electric signal to a first electrode layer and a second electrode layer connected to a red pixel while supplying a solution containing red micro LEDs among a plurality of micro LEDs to arrange the plurality of red micro LEDs at a regular spacing;
applying an electric signal to a first electrode layer and a second electrode layer connected to a green pixel while supplying a solution containing green micro LEDs among the plurality of micro LEDs to arrange the plurality of green micro LEDs at a regular spacing; and
applying an electric signal to a first electrode layer and a second electrode layer connected to a blue pixel while supplying a solution containing blue micro LEDs among the plurality of micro LEDs to arrange the plurality of blue micro LEDs at a regular spacing.

19. A method for manufacturing a micro LED display, the method comprising:

(a) disposing a transistor in each of a plurality of pixel areas defined as data lines and gate lines intersect each other on a substrate;

(b) disposing a first electrode layer and a second electrode layer spaced apart from each other in each of the plurality of pixel areas;

(c) disposing an insulating layer on the substrate where the first electrode layer and the second electrode layer are disposed;

(d) defining a plurality of grooves at a regular spacing in a portion of the insulating layer corresponding to an area between the first electrode layer and the second electrode layer; and (e) generating an electric field in the first electrode layer and the second electrode layer while supplying a solution containing a plurality of micro LEDs onto the substrate to align the plurality of micro LEDs at a regular spacing by a repulsion occurring between one micro LED and a further micro LED adjacent thereto, wherein the (e) includes aligning at least one micro LED in one groove, wherein one micro LED is disposed in each pixel area, and wherein each of a length of the groove and a length of the at least one micro LED is greater than a distance of the area between the first electrode layer and the second electrode layer.

20. The method of claim 19, wherein the (e) further includes, for each of the plurality of pixel areas:

applying an electric signal to a first electrode layer and a second electrode layer connected to a red pixel while supplying a solution containing red micro LEDs among a plurality of micro LEDs to arrange the plurality of red micro LEDs at a regular spacing;

applying an electric signal to a first electrode layer and a second electrode layer connected to a green pixel while supplying a solution containing green micro LEDs among the plurality of micro LEDs to arrange the plurality of green micro LEDs at a regular spacing; and applying an electric signal to a first electrode layer and a second electrode layer connected to a blue pixel while supplying a solution containing blue micro LEDs among the plurality of micro LEDs to arrange the plurality of blue micro LEDs at a regular spacing.

* * * * *